(12) United States Patent
Henley et al.

(10) Patent No.: US 7,595,499 B2
(45) Date of Patent: Sep. 29, 2009

(54) METHOD AND SYSTEM FOR FABRICATING STRAINED LAYERS FOR THE MANUFACTURE OF INTEGRATED CIRCUITS

(75) Inventors: Francois J. Henley, Aptos, CA (US); Philip James Ong, Milpitas, CA (US); Igor J. Malik, Palo Alto, CA (US); Harry R. Kirk, Campbell, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 12/070,574

(22) Filed: Feb. 19, 2008

(65) Prior Publication Data

US 2008/0141510 A1 Jun. 19, 2008

Related U.S. Application Data

(60) Continuation of application No. 11/378,126, filed on Mar. 17, 2006, now Pat. No. 7,391,047, which is a division of application No. 11/043,477, filed on Jan. 24, 2005, now Pat. No. 7,094,666.

(60) Provisional application No. 60/592,532, filed on Jul. 29, 2004.

(51) Int. Cl.
*H01L 29/06* (2006.01)
*H01L 31/072* (2006.01)
*H01L 31/0336* (2006.01)
*H01L 31/0328* (2006.01)

(52) U.S. Cl. ............ 257/18; 257/19; 257/347; 257/E29.193

(58) Field of Classification Search ............ None
See application file for complete search history.

(56) References Cited

U.S. PATENT DOCUMENTS 7,391,047 B2 * 6/2008 Henley et al. .............. 257/18

* cited by examiner

*Primary Examiner*—Zandra Smith
*Assistant Examiner*—Khanh B Duong
(74) *Attorney, Agent, or Firm*—Townsend and Townsend and Crew LLP

(57) ABSTRACT

A method for forming a strained layer of semiconductor material, e.g., silicon, germanium, Group III/V, silicon germanium alloy. The method includes providing a non-deformable surface region having a first predetermined radius of curvature, which is defined by R(1) and is defined normal to the surface region. The method includes providing a first substrate (e.g., silicon wafer) having a first thickness. Preferably, the first substrate has a face, a backside, and a cleave plane defined within the first thickness. The method includes a step of overlying the backside of the first substrate on a portion of the surface region having the predetermined radius of curvature to cause a first bend within the thickness of material to form a first strain within a portion of the first thickness. The method provides a second substrate having a second thickness, which has a face and a backside. The method includes a step of overlying the face of the second substrate on a portion of the face of the first substrate to cause a second bend within the thickness of material to form a second strain within a portion of the second thickness. A step of joining the face of the second substrate to the face of the first substrate form a sandwich structure while maintaining the first bend in the first substrate and the second bend in the second substrate. Preferably, joining occurs using a low temperature process such as plasma activated bonding or the like.

14 Claims, 10 Drawing Sheets

Substrate Bonding Assembly

Substrate Bonding Assembly

Raman Spectrum Si-l: EAG Si Reference

Raman Spectrum 1: "Flat" Bonding Reference

Raman Spectrum 2: "Bent Pair - 0.22% Film Strain"

METHOD AND SYSTEM FOR FABRICATING STRAINED LAYERS FOR THE MANUFACTURE OF INTEGRATED CIRCUITS

CROSS REFERENCE INFORMATION

This application claims benefit to U.S. Patent Provisional Application No. 60/592,532, filed Jul. 29, 2004 and is included herein by this reference.

BACKGROUND OF THE INVENTION

The present invention is directed to integrated circuits and their processing for the manufacture of semiconductor devices. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of such devices on conventional bulk silicon. Conventional bulk silicon has been used for numerous years. As devices become smaller, however, conventional bulk silicon has limitations. These limitations include isolation problems between transistor device structures. Additionally, conventional bulk silicon has imperfections, which lead to limitations with device speed and reliability issues. These and other limitations will be described in further detail throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

In a specific embodiment, the present invention provides a method for forming a strained layer of semiconductor material, e.g., silicon, germanium, Group III/V, silicon germanium alloy. The method includes providing a non-deformable surface region having a first predetermined radius of curvature, which is defined by $R(1)$ and is defined normal to the surface region. The method includes providing a first substrate (e.g., silicon wafer) having a first thickness. Preferably, the first substrate has a face, a backside, and a cleave plane defined within the first thickness. The method includes a step of overlying the backside of the first substrate on a portion of the surface region having the predetermined radius of curvature to cause a first bend within the thickness of material to form a first strain within a portion of the first thickness. The method provides a second substrate having a second thickness, which has a face and a backside. The method includes a step of overlying the face of the second substrate on a portion of the face of the first substrate to cause a second bend within the thickness of material to form a second strain within a portion of the second thickness. A step of joining the face of the second substrate to the face of the first substrate forms a sandwich structure while maintaining the first bend in the first substrate and the second bend in the second substrate. Preferably, joining occurs using a low temperature process such as plasma activated bonding or the like.

The method releases a portion of a thickness of the first substrate along a vicinity of the cleave plane to free the portion of the thickness of material from a remaining portion of the first substrate while being attached to the second substrate. The method conforms the shape of the thickness of material to the second substrate as a radius of curvature on the second substrate approaches a second predetermined radius ($R2$) of curvature. The method increases a magnitude of a strain from the first strain to a third strain within the thickness of material as the thickness of conforms in shape to the second substrate as the radius of curvature on the second substrate approaches the second predetermined radius of curvature. Preferably, the radius of curvature R2 approaches infinity to characterize a flat second substrate with a strained layer overlying the second substrate.

In an alternative specific embodiment, the present invention provides a method for forming a strained layer of semiconductor material, e.g., silicon, germanium, Group III/IV, silicon germanium alloy. The method includes providing a non-deformable surface region having a first predetermined radius of curvature, which is defined by $R(1)$ and is defined normal to the surface region. The method includes providing a first substrate (e.g., silicon wafer) having a first thickness. Preferably, the first substrate has a face and a backside. The method includes a step of overlying the backside of the first substrate on a portion of the surface region having the predetermined radius of curvature to cause a first bend within the thickness of material to form a first strain within a portion of the first thickness. The method provides a second substrate having a second thickness, which has a face, a backside, and a cleave plane within the second thickness. The method includes a step of overlying the face of the second substrate on a portion of the face of the first substrate to cause a second bend within the thickness of material to form a second strain within a portion of the second thickness. A step of joining the face of the second substrate to the face of the first substrate forms a sandwich structure while maintaining the first bend in the first substrate and the second bend in the second substrate. Preferably, joining uses a step of plasma activated bonding or the like.

The method releases a portion of a thickness the second substrate along a vicinity of the cleave plane to free the portion of the thickness of material from a remaining portion of the second substrate while being attached to the first substrate. The method conforms the shape of the thickness of material to the first substrate as a radius of curvature on the first substrate approaches a second predetermined radius (R2) of curvature. The method increases a magnitude of a strain from the first strain to a third strain within the thickness of material as the thickness of conforms in shape to the first substrate as the radius of curvature on the first substrate approaches the second predetermined radius of curvature. Preferably, the radius of curvature R2 approaches infinity to characterize a flat first substrate with a strained layer overlying the first substrate.

In yet an alternative specific embodiment, the present invention provides a system for forming a strained layer of semiconductor material. The system includes a non-deformable surface region having a first predetermined radius of curvature, the first predetermined radius of curvature being defined by R(1) and being defined normal to the surface region. The system also includes a first substrate having a first thickness, the first substrate having a face, a backside, and a cleave plane within the first thickness, the first substrate overlying the backside of the first substrate on a portion of the surface region having the predetermined radius of curvature to cause a first bend within the thickness of material to form a first strain within a portion of the first thickness. A second substrate having a second thickness, the second substrate having a face and a backside, the second substrate overlying the face of the second substrate on a portion of the face of the first substrate to cause a second bend within the thickness of material to form a second strain within a portion of the second thickness, whereupon the face of the second substrate is joined to the face of the first substrate to form a sandwich structure while maintaining the first bend in the first substrate and the second bend in the second substrate. The first substrate includes a portion of a thickness that is released along a vicinity of the cleave plane to free the portion of the thickness of material from a remaining portion of the first substrate while being attached to the second substrate and the thickness of material conforms to a shape of the second substrate as a radius of curvature on the second substrate approaches a second predetermined radius (R2) of curvature thereby increasing a magnitude of a strain from the first strain to a third strain within the thickness of material as the thickness of conforms in shape to the second substrate as the radius of curvature on the first substrate approaches the second predetermined radius of curvature. Alternatively, the cleave plane can be within the second substrate, depending upon the specific embodiment.

Depending upon the specific embodiment, one or more of these features may also be included.

1. Plasma activated-bonding of the wafer occurs in certain embodiments. Here, bonding would be uniaxial (e.g., cylindrically curved) or conical (e.g., biaxially curved). Essentially, any shape selected allows a desired stress distribution on the final film. Given the following relationship, the bending imparts a strain (epsilon) of h/(2*R) where h=wafer thickness and R=bend radius. For 0.5% strain for example, the stress is Young's modulus (E) at the desired direction * strain. For <110> direction in silicon, E=169 GPa, for <100>, E=130 GPa. For a 0.5% strain at <110>, the stress is about 340 MPa. Note that the example would be to bend the donor convex to cause 340 MPa tensile and the handle is bonded onto this donor in the corresponding concave shape (340 MPa compressive). When bonded and clamped, the bond does not see any shear stresses since the forces are held and taken up by the clamping jig. Once the Bond Treatment (BT) is completed, the handle concave wafer can be unclamped and "peeled" off the donor where the handle now has the cleaved film attached to it. Once this handle wafer springs back flat, it adds another 240 MPa tensile stress to the film which would now be 2*340 MPa or 680 MPa. The handle/donor shape therefore doubles the stress seen at the wafer surfaces when the film is cleaved and the handle wafer is allowed to spring back to its original flat shape. Note that a reverse compressive film stress is possible by having the handle be convex while the donor is concave.

2. According to a specific embodiment, release of the film of material occurs using a controlled cleaving process ("CCP"). Controlled cleaving is described in U.S. Pat. No. 6,013,563, commonly assigned, and hereby incorporated by reference for all purposes. The controlled cleaving process can be used on a curved wafer pair according to a specific embodiment. According to other embodiments, which also may be controlled, would include releasing the film of material using a processed commonly called Smart-Cut™ of Soitec SA of France. Still further other techniques for cleaving such as ELTRAN™ from Canon, Inc. Of course, one of ordinary skill in the art would recognize other variations, alternatives, and modifications.

3. Additionally, clamping the wafer pair occurs so the bond treatment is made with the bond interface that is essentially free of shear stress according to a specific embodiment. If the wafers are bonded curved and bond treatment (e.g., thermal treatment) is provided without clamping, certain stresses may degrade the bond and perhaps contribute to voids, debonds, and other bond failure mechanisms.

4. Depending upon the embodiment, the present method can be cluster tool compatible. Such cluster tool includes combining the plasma-activation and curved bonding in a tool where the result is a clamped or unclamped wafer pair that has the stresses within the wafer of a desired sign and magnitude.

5. Optionally, the joined substrates can be clamped using a jig, which can include the sandwich structure while being subjected to thermal treatment. In a specific embodiment, a cylindrical or conical shape structure forms certain stresses on the substrates and also can be used to provide heat (similar to a hot plate). Here, the substrates can be mounted on this chuck that would go through a heat cycle on the stressing jig itself. Preferably, faster ramp up and cool down cycles occur to provide a selected thermal profile. If the thermal profile is correctly selected, efficient thermal cycling occurs according to a specific embodiment.

Other benefits are achieved by way of the present invention over conventional techniques. For example, the present technique provides an easy to use process that relies upon conventional technology. In some embodiments, the method may provide higher device yields in dies per wafer. Additionally, the method provides a process that is compatible with conventional process technology without substantial modifications to conventional equipment and processes. Preferably, the method provides for certain regions of silicon that strained using a novel support member or curved surface region having a predetermined radius of curvature. More preferably, the invention provides a resulting thin film structure, which has been strained, that is substantially free from dislocations, and other imperfections. Preferably, the invention provides for strained silicon-on-silicon structures that substantially reduces threading dislocation density (TDD) issues. Additionally, the invention provides a resulting substrate with strain that is unlikely to relax for any area size while the strain may relax for conventional strained SOI areas during subsequent integrated circuit processing, which often requires high temperatures. If an intervening dielectric layer is present between the cleaved film and the handle substrate, a strained silicon on insulator (SSOI) structure can also be fabricated with similar defect density and quality advantages. In each of these structures, a feature of this invention allows the film to be strained uniaxially or biaxially. The film strain can also be selected to be compressive or tensile. Additionally, the present invention provides a resulting structure substantially free from underlying dislocation rich germanium bearing layers or other undesirable impurities that may lead to problems with device quality and/or reliability. A substantially planar strained material (e.g., silicon) surface may also be achieved using the present invention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
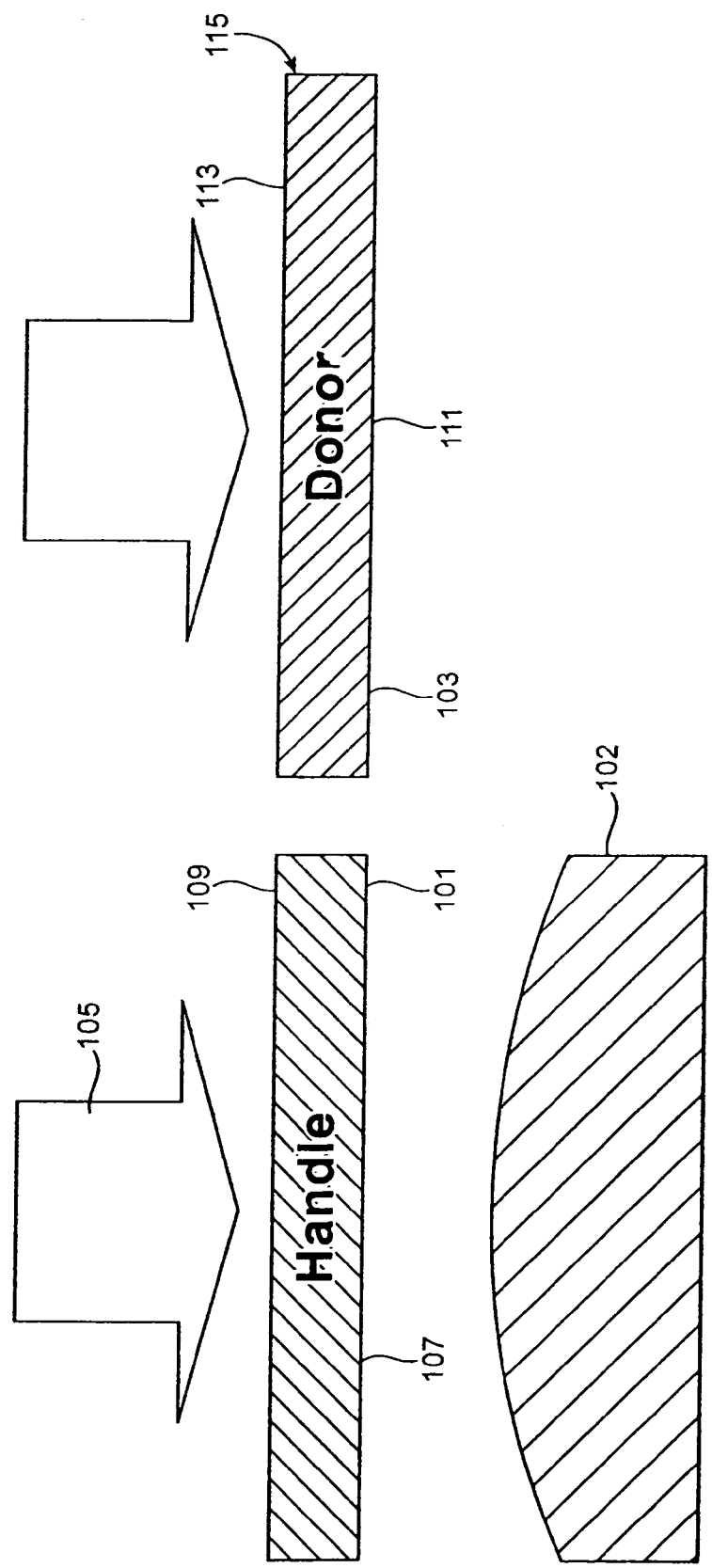
FIGS. 1 through 4 illustrate a method of forming a strained substrate according to an embodiment of the present invention.

According to the present invention, techniques directed to integrated circuits and their processing for the manufacture of semiconductor devices are provided. More particularly, the invention provides a method and structures for manufacturing strained film(s) of material using a layer transfer process. Merely by way of example, the invention has been applied to strained silicon bearing materials for semiconductor substrates. But it would be recognized that the invention has a much broader range of applicability.

An method of manufacturing a strained layer on a semiconductor substrate is briefly outlined below.

1. Provide a non-deformable surface region having a first predetermined radius of curvature, which is defined by R(1) and is defined normal to the surface region;
2. Provide a first substrate having a first thickness, a face, and a backside;
3. Overlie the backside of the first substrate on a portion of the surface region having the predetermined radius of curvature to cause a first bend within the thickness of material to form a first strain within a portion of the first thickness;
4. Provide a second substrate having a second thickness, a face, a backside, and a cleave plane within the second thickness;
5. Overlie the face of the second substrate on a portion of the face of the first substrate to cause a second bend within the thickness of material to form a second strain within a portion of the second thickness;
6. Join the face of the second substrate to the face of the first substrate to form a sandwich structure while maintaining the first bend in the first substrate and the second bend in the second substrate; and
7. Release a portion of a thickness of the second substrate along a vicinity of the cleave plane to free the portion of the thickness of material from a remaining portion of the second substrate while being attached to the first substrate; and
8. Conform the shape of the thickness of material to the first substrate as a radius of curvature on the first substrate approaches a second predetermined radius (R2) of curvature;
9. Increase a magnitude of a strain from the first strain to a third strain within the thickness of material as the thickness of conforms in shape to the first substrate as the radius of curvature on the first substrate approaches the second predetermined radius of curvature; and
10. Perform other steps, as desired.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 4 illustrate a method of forming a strained substrate according to an embodiment of the present invention. These diagrams are merely examples, which should not unduly limit the scope of the claims herein. One of ordinary skill in the art would recognize other variations, modifications, and alternatives. As shown, the method is directed to forming a strained layer of semiconductor material, e.g., silicon, germanium, Group III/V, silicon germanium alloy. The method includes providing a non-deformable surface region 102 having a first predetermined radius of curvature, which is defined by R(1) and is defined normal to the surface region. Preferably, the first radius of curvature is defined by an imaginary circle, which is continuous or variable across a surface of the substrate. There can be other variations, modifications, and alternatives.

Figure 2:
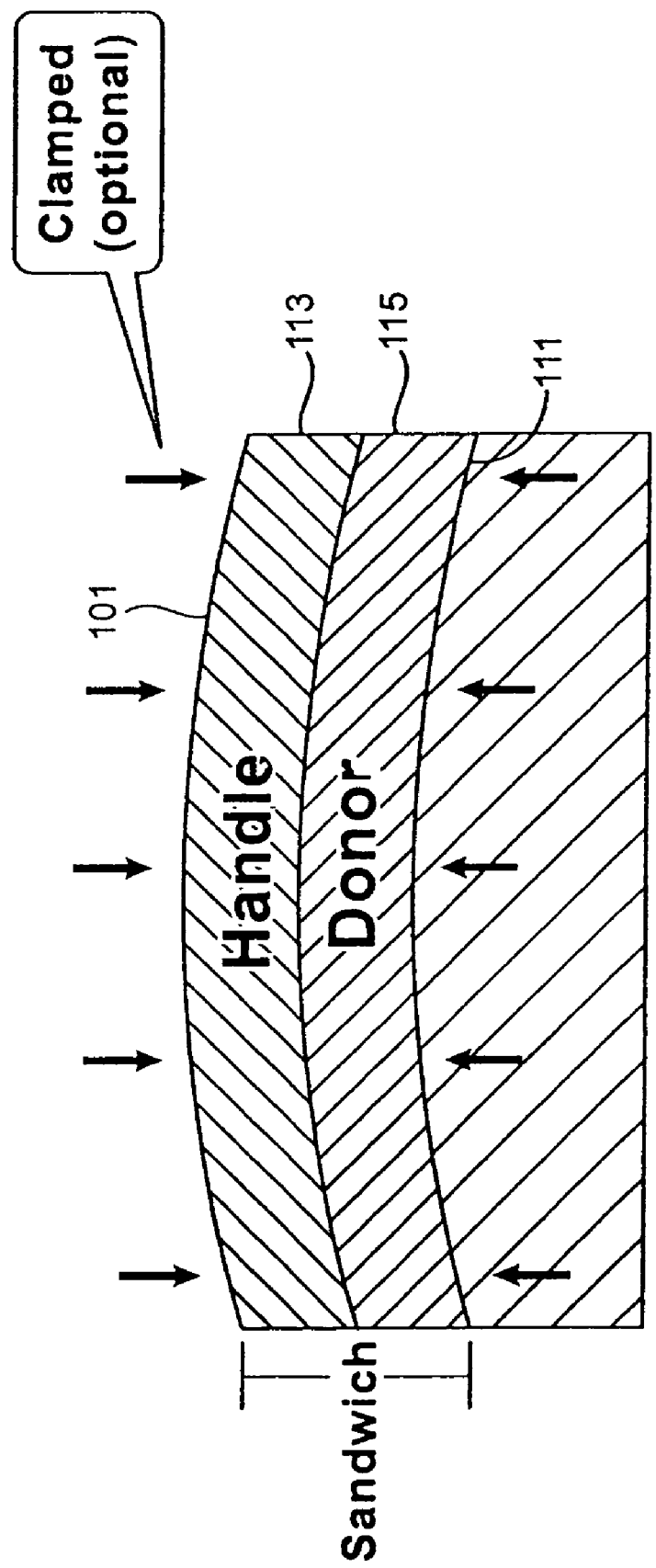

The method includes providing a first substrate (e.g., silicon wafer) 103 having a first thickness. Preferably, the first substrate has a face 113, a backside 111, and a cleave plane 115 defined within the first thickness as illustrated by FIG. 1. Preferably, the cleave plane is formed within the first thickness slightly below the face. A distance between the face and the cleave plane is a predetermined thickness, which serves as a device layer in later processes. The method includes a step of overlying the backside of the first substrate on a portion of the surface region having the predetermined radius of curvature to cause a first bend within the thickness of material to form a first strain within a portion of the first thickness, as illustrated by FIG. 2. The method provides a second substrate 101 having a second thickness, which has a face 109 and a backside 107. The method includes a step of overlying the face of the second substrate on a portion of the face of the first substrate to cause a second bend within the thickness of material to form a second strain within a portion of the second thickness. As shown, the donor substrate portion within the vicinity of the bond interface is stained via tensile mode.

A step of joining the face of the second substrate to the face of the first substrate forms a sandwich structure while maintaining the first bend in the first substrate and the second bend in the second substrate. Preferably, joining occurs using a low temperature process such as plasma activated bonding 105 or the like. In a specific embodiment, the plasma activated bonding is maintained at less than 1000 degrees Celsius or less than 500 degrees Celsius. Bonding can occur via silicon dioxide surface or silicon to silicon surfaces depending upon the embodiment. Other types of bonding include, but are not limited to, glue layers, adhesives, spin on glass layers, etc. Depending upon the embodiment, the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate. The handle substrate portion within the vicinity of the bond interface is strained via compression mode. Of course, there can be other variations, modifications, and alternatives.

Figure 3:
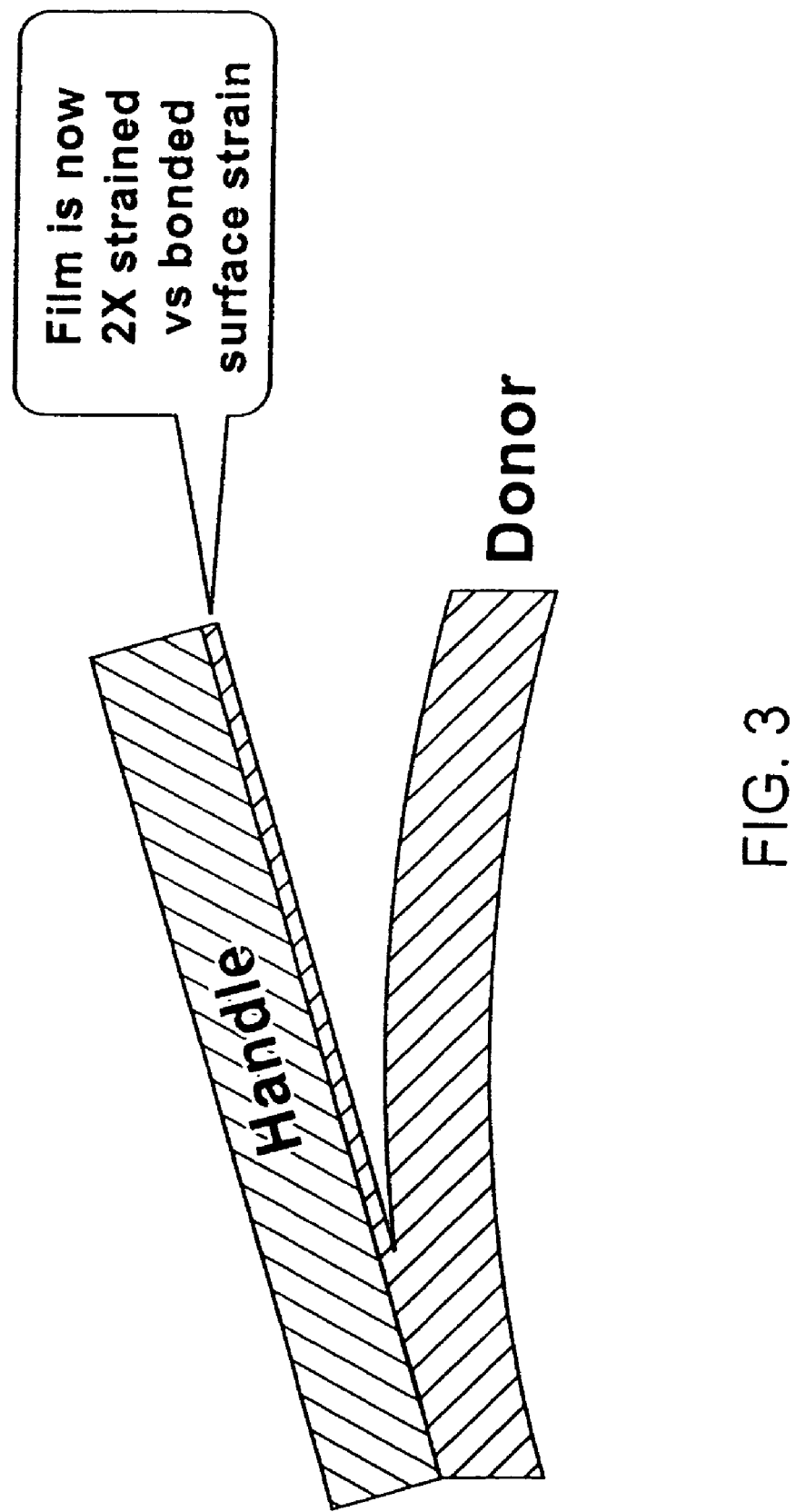

In a specific embodiment, the method includes performing a bond treatment to finish the joining of the first substrate and the second substrate, as shown in FIG. 2. The bond treatment can be any suitable technique such as thermal annealing, and the like. Referring to FIG. 3, the method includes releasing a portion of a thickness the second substrate along a vicinity of the cleave plane to free the portion of the thickness of material from a remaining portion of the first substrate while being attached to the second substrate. In a specific embodiment, releasing occurs using a controlled cleaving process, such as the noted above. In another embodiment, the releasing can occur using a process commonly called the Smart Cut™ process marketed by Soitec SA of France. Another technique can be a process called ELTRAN™ process marketed by Canon, Inc. Any combinations of these processes can also be used depending upon the embodiment.

Figure 4:
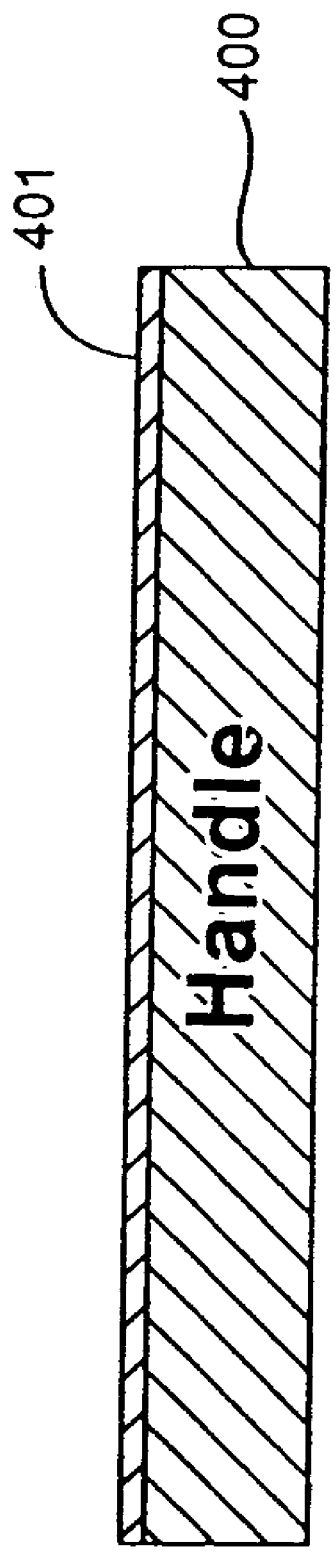

The method conforms the shape of the thickness of material to the second substrate as a radius of curvature on the second substrate approaches a second predetermined radius (R2) of curvature. Preferably, the second radius of curvature is defined by infinity, which is where the substrate is essentially flat and free from any bends. The method increases a magnitude of a strain from the first strain to a third strain within the thickness of material as the thickness of conforms in shape to the second substrate as the radius of curvature on the second substrate approaches the second predetermined radius of curvature. Preferably, the radius of curvature R2 approaches infinity to characterize a flat second substrate with a strained layer overlying the second substrate, as illustrated in FIG. 4. As shown, the second substrate 400 includes an overlying strained layer 401, which preferably includes a magnitude of strains from the first bend and the re-bend back to the flat shape structure according to a specific embodiment. [WE SHOULD PREPARE A DRAWING OF INCREASING THE STRAIN DURING R1 AND R2]

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein.

An alternative method of manufacturing a strained layer on a semiconductor substrate is briefly outlined below.
1. Provide a non-deformable surface region having a first predetermined radius of curvature, which is defined by R(1) and is defined normal to the surface region;
2. Provide a first substrate having a first thickness, a face, a backside, and a cleave plane defined within the first thickness;
3. Overlie the backside of the first substrate on a portion of the surface region having the predetermined radius of curvature to cause a first bend within the thickness of material to form a first strain within a portion of the first thickness;
4. Provide a second substrate having a second thickness, a face, and a backside;
5. Overlie the face of the second substrate on a portion of the face of the first substrate to cause a second bend within the thickness of material to form a second strain within a portion of the second thickness;
6. Join the face of the second substrate to the face of the first substrate to form a sandwich structure while maintaining the first bend in the first substrate and the second bend in the second substrate; and
7. Release a portion of a thickness the first substrate along a vicinity of the cleave plane to free the portion of the thickness of material from a remaining portion of the first substrate while being attached to the second substrate; and
8 Conform the shape of the thickness of material to the second substrate as a radius of curvature on the second substrate approaches a second predetermined radius (R2) of curvature;
9 Increase a magnitude of a strain from the first strain to a third strain within the thickness of material as the thickness of conforms in shape to the second substrate as the radius of curvature on the second substrate approaches the second predetermined radius of curvature; and
10. Perform other steps, as desired.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 5 through 8 illustrate a method of forming a strained substrate according to an alternative embodiment of the present invention. These diagrams are merely examples, which should not unduly limit the scope of the claims herein. One of ordinary skill in the art would recognize other variations, modifications, and alternatives. As shown, the method is directed to forming a strained layer of semiconductor material, e.g., silicon, germanium, Group III/V, silicon germanium alloy. The method includes providing a non-deformable surface region 102 having a first predetermined radius of curvature, which is defined by R(1) and is defined normal to the surface region. Preferably, the first radius of curvature is defined by an imaginary circle, which is continuous or variable across a surface of the substrate. There can be other variations, modifications, and alternatives.

Figure 5:
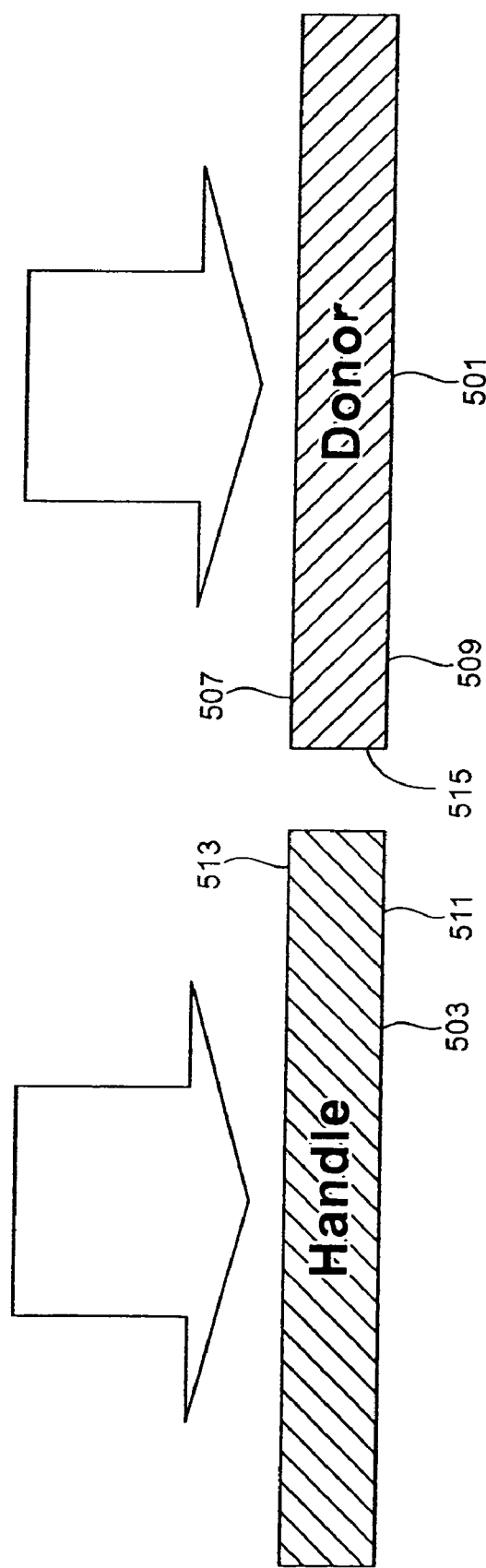
FIGS. 5 through 8 illustrate a method of forming a strained substrate according to an alternative embodiment of the present invention.
Figure 6:
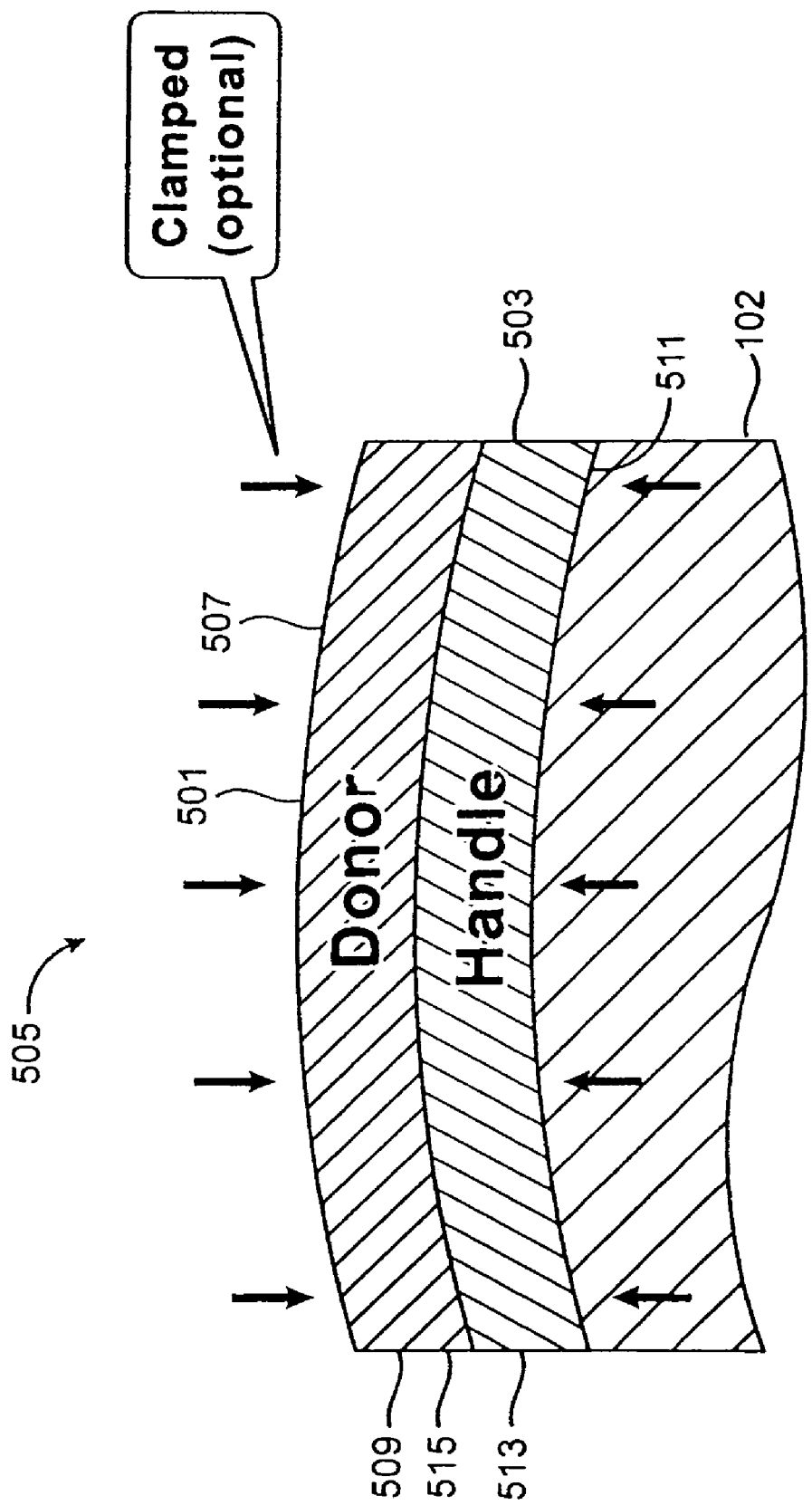

The method includes providing a first substrate (e.g., silicon wafer) 503 having a first thickness. Preferably, the first substrate has a face 513 and a backside 511 as illustrated by FIG. 5. The method includes a step of overlying the backside of the first substrate on a portion of the surface region having the predetermined radius of curvature to cause a first bend within the thickness of material to form a first strain within a portion of the first thickness, as illustrated by FIG. 6. The method provides a second substrate 501 having a second thickness, which has a face 509, a backside 507, and a cleave plane 515 defined within the second thickness. The method includes a step of overlying the face of the second substrate on a portion of the face of the first substrate to cause a second bend within the thickness of material to form a second strain within a portion of the second thickness. As shown, the donor substrate portion within the vicinity of the bond interface is strained via compressive mode.

A step of joining the face of the second substrate to the face of the first substrate forms a sandwich structure while maintaining the first bend in the first substrate and the second bend in the second substrate. Preferably, joining occurs using a low temperature process such as plasma activated bonding 505 or the like. In a specific embodiment, the plasma activated bonding is maintained at less than 1000 degrees Celsius or less than 500 degrees Celsius. Bonding can occur via silicon dioxide surface or silicon to silicon surfaces depending upon the embodiment. Other types of bonding include, but are not limited to, glue layers, etc. Depending upon the embodiment, the joining is a rolling process that physically mates the face of the second substrate to the face of the first substrate using a rolling action defined by an axis formed between a separated region between the face of the second substrate and the face of the first substrate and a connected region between the face of the second substrate and the face of the first substrate. The handle substrate portion within the vicinity of the in bond interface is trained via compression mode. Of course, there can be other variations, modifications, and alternatives.

Figure 7:
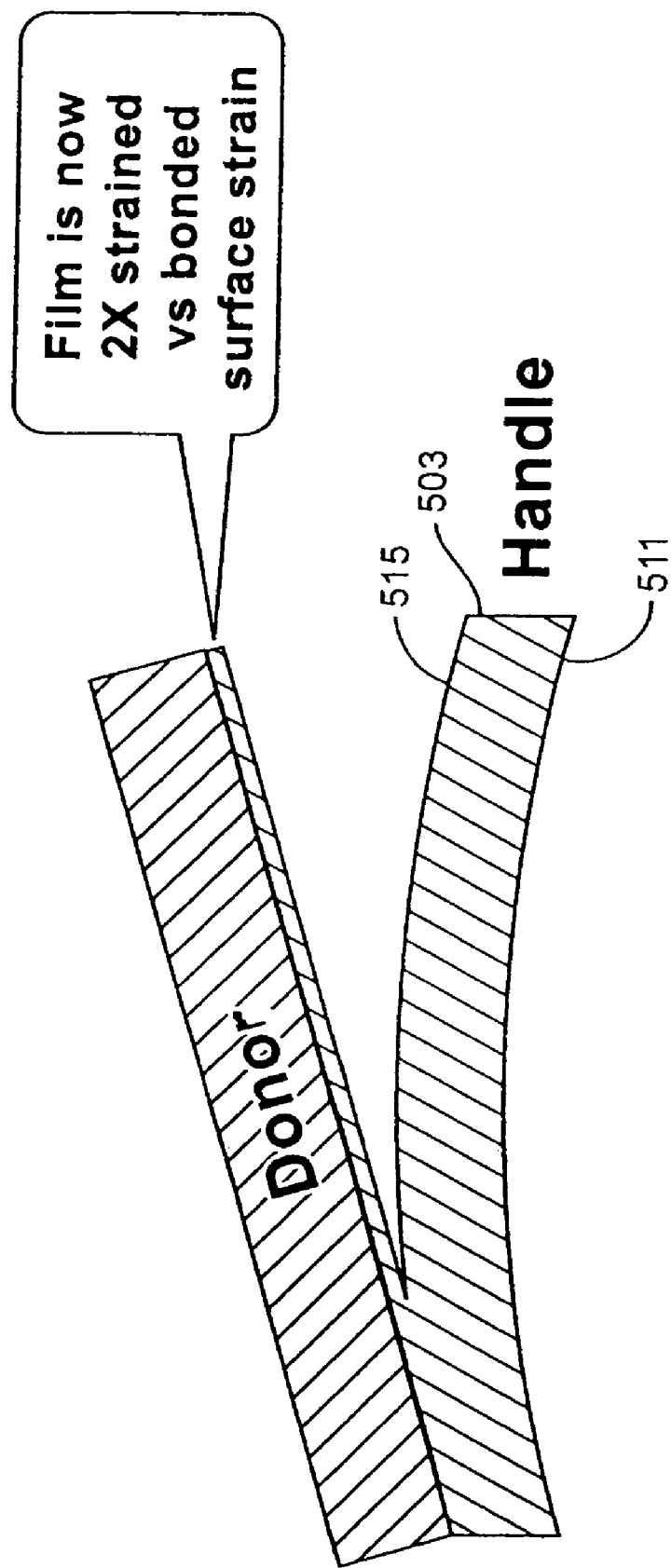

In a specific embodiment, the method includes performing a bond treatment to finish the joining of the first substrate and the second substrate. The bond treatment can be any suitable technique such as thermal annealing, and the like. Referring to FIG. 7, the method includes releasing a portion of a thickness of the second substrate along a vicinity of the cleave plane to free the portion of the thickness of material from a remaining portion of the second substrate while being attached to the first substrate. In a specific embodiment, releasing occurs using a controlled cleaving process, such as the noted above. In another embodiment, the releasing can occur using a process commonly called the Smart Cut™ process marketed by Soitec SA of France. Another technique can be a process called ELTRAN™ process marketed by Canon, Inc. Any combination of these processes can also be used.

Figure 8:
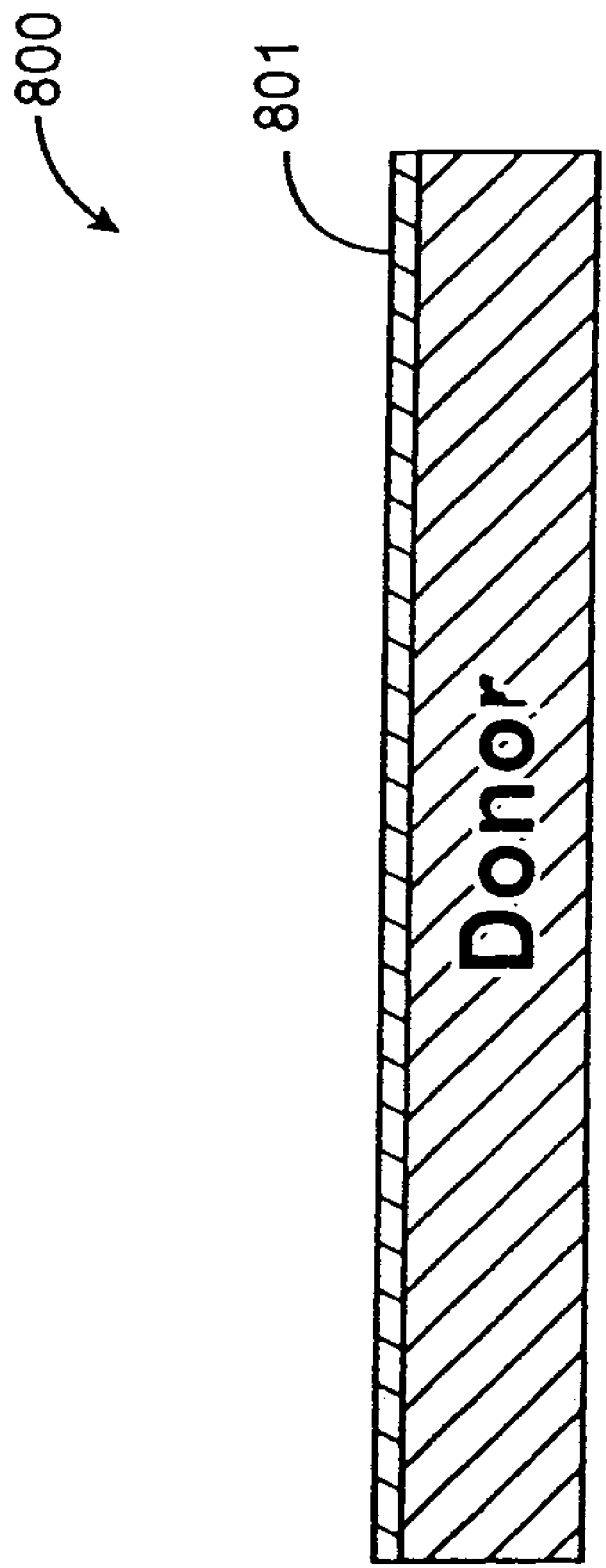

The method conforms the shape of the thickness of material to the first substrate as a radius of curvature on the first substrate approaches a second predetermined radius (R2) of curvature. Preferably, the second radius of curvature is defined by infinity, which is where the substrate is essentially flat and free from any bends. The method increases a magnitude of a strain from the first strain to a third strain within the thickness of material as the thickness of conforms in shape to the second substrate as the radius of curvature on the first substrate approaches the second predetermined radius of curvature. Preferably, the radius of curvature R2 approaches infinity to characterize a flat first substrate with a strained layer overlying the second substrate, as illustrated in FIG. 8. As shown, the second substrate 800 includes an overlying strained layer 801, which preferably includes a magnitude of strains from the first bend and the re-bend back to the flat shape structure according to a specific embodiment.

The above sequence of steps provides a method according to an embodiment of the present invention. As shown, the method uses a combination of steps including a way of forming a strained silicon layer overlying a handle substrate. Other alternatives can also be provided where steps are added, one or more steps are removed, or one or more steps are provided in a different sequence without departing from the scope of the claims herein.

EXAMPLES

To prove the principle and operation of the process invention, experiments have been performed. These experiments are not intended to limit the spirit and scope of the invention as defined by the claims herein. One of ordinary skill in the art would recognize other variations, modifications and alternatives. In the experiments, 200 mm <100> polished silicon wafers (725µ thick, 6-9 ohm-cm P-type Boron doped) were used. A set of wafers were deposited with a 1µ boron epitaxial layer of ~10 Ω-cm, oxidized to an oxide thickness of 400 Å to 1000 Å and then implanted with hydrogen ions at an energy and dose in a range of 60 KeV to 80 KeV and a dose of 6.0 to 6.5E16/cm$^2$, respectively.

Figure 9:
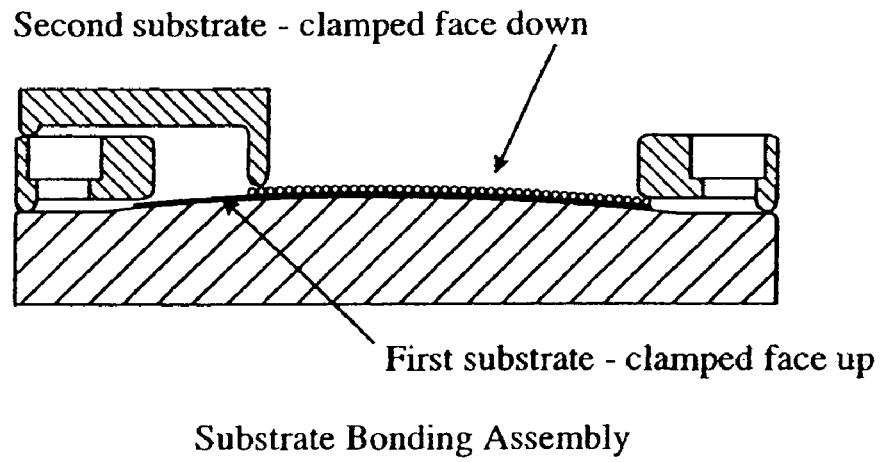
FIGS. 9 through 12 illustrate experimental results according to embodiment of the present invention.

Wafers identified as the first substrate (epitaxial deposition/oxidized/implanted wafers) were diced into 2.5 cm (W)× 7.0 cm (L) strips and then backgrinded to a final thickness of 340 µm. Whereas, a second group of wafers, identified as the second substrate (bare silicon substrate) were diced into 2.5 cm×5.5 cm strips, but no backgrind. The strips were diced with the length being in the <110> direction. The group of strips was then plasma activated using a dual frequency plasma-activation process. [PROCESS RECIPE?] A strip from first substrate was then manually set and clamped into a bonding fixture (see FIG. 9) face up with a predetermined radius of curvature (24.2 cm) which was designed to yield a surface of approximately 0.07% strain. A strip from the second substrate was then placed face down onto the first substrate. The predetermined radius is maintained and designed to impart strain on the second surface of 0.15% strain. Following the bonding steps, the assembly was placed in an oven for a final bake treatment of approximately 300° C. to 350° C. for 1 hour. After the bake treatment, the second substrate is unclamped while initiating a controlled cleave process to peel off the engineered cleave layer off the first substrate.

After the room temperature controlled cleave process, the expected measured strain is the sum of the two induced strain or 0.22%. In crystalline silicon, the Young's or elastic modulus E is anisotropic, meaning that it's value is direction dependent. For example, for three major directions <100>, <110> and <111> E varies as follows:

$E_{<100>} = 130$ GPa $E_{<110>} = 169$ GPa $E_{<111>} = 187$ GPa,

Where E is given by $E = <\sigma/\in$, the ratio of stress to strain in the elastic regime. Therefore the expected tensile stress for a layer of silicon strained expansively 0.22% in the <110> direction would be approximately 372 MPa.

Strain can be measured by standard Raman spectroscopy measurement techniques. The shift in wavenumbers (cm$^{-1}$) for silicon has been calibrated to approximately 500 MPa (tensile stress is a reduction in wavenumber while a compressive stress is an increase in wavenumber). From the experiments, the samples measured strain of 400±75 MPA. Table 1 below shows the results of the measured wavenumbers on a bare silicon substrate, a control strip and the bent strip of silicon subjected to a predetermined radius of curvature of 24.2 cm.

TABLE 1

Raman Measurements

| Measurement # | Sample | Spectrum # | Si Peak (cm−1) | Delta Si Peak (cm−1) | Implant Damage Peak (cm−1) |
|---|---|---|---|---|---|
| 1 | EAG Si Reference | Si-1 | 520.7 | 0 | n/a |
| 2 | Sample #1 ("Flat" Bonding Reference) | 1 | 520.8 (520.820) | 0 | 514.3 (514.297) |
| 3 | Sample #2 ("Bent Pair 0.22% Film Strain") | 2 | 520.0 (520.033) | 0.8 | 514.5 (514.576) |

Figure 10:
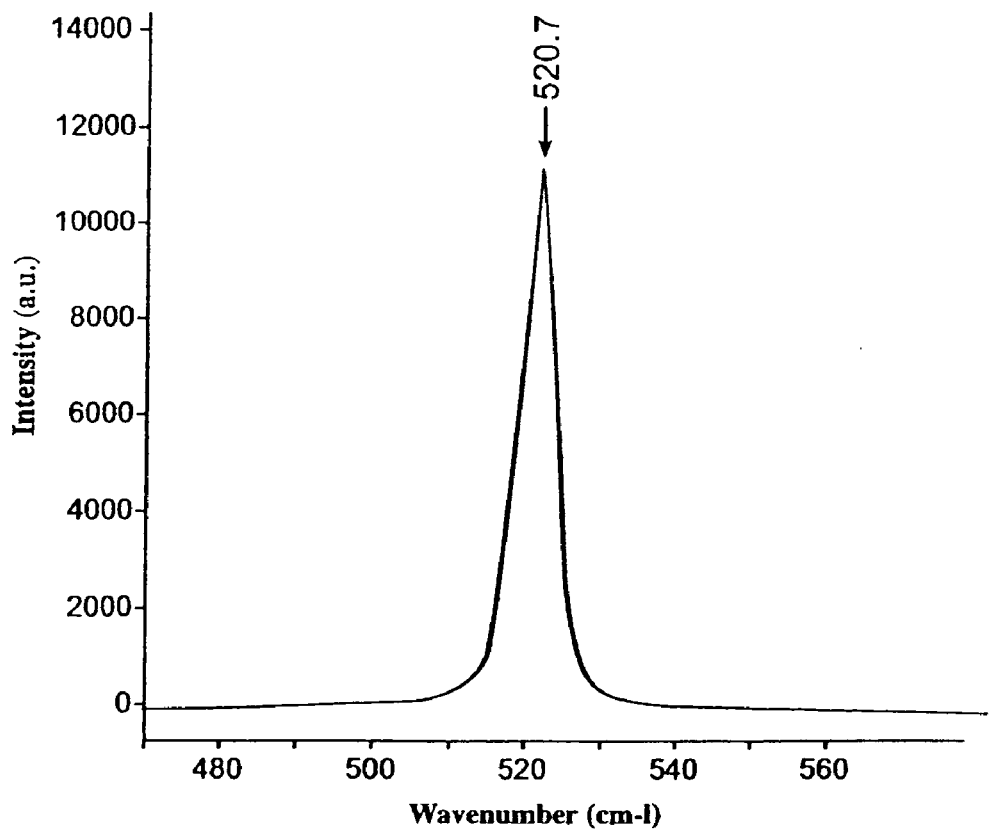
Figure 11:
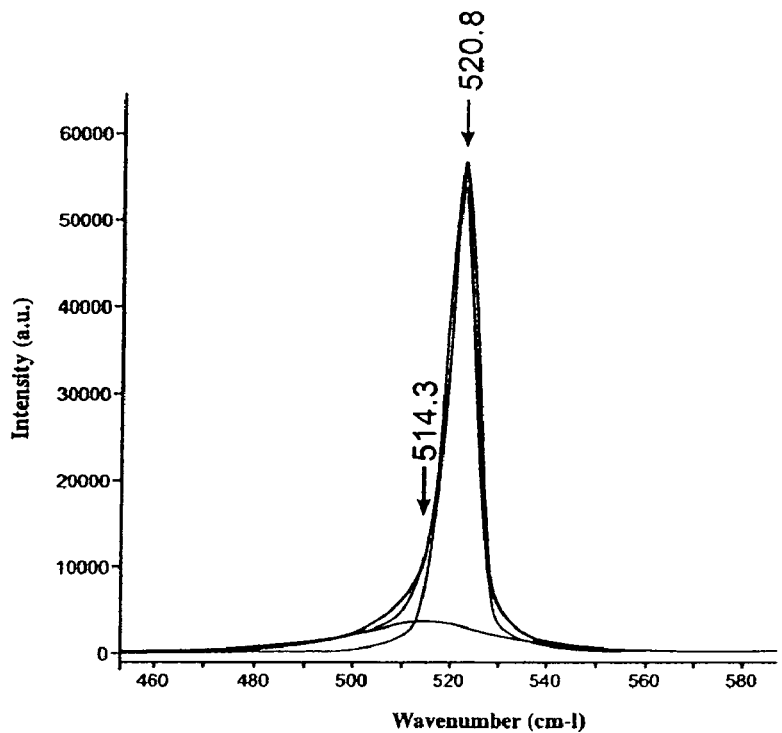
Figure 12:
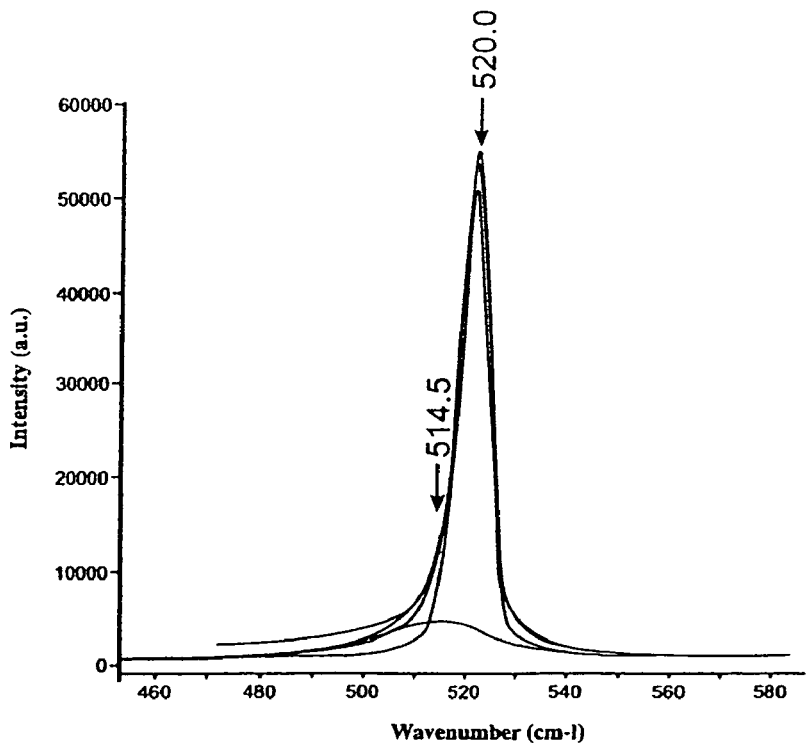

From the Raman measurement (see FIGS. 10 through 12) and analysis, there is very good agreement of the expected and measurement strained value as explained by the invention. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for forming a strained layer of semiconductor material, the system comprising:
   a non-deformable surface region having a first predetermined radius of curvature, the first predetermined radius of curvature being defined by R(1) and being defined normal to the surface region;
   a first substrate having a first thickness, the first substrate having a face, a backside, and a cleave plane within the first thickness, the first substrate overlying the backside of the first substrate on a portion of the surface region having the predetermined radius of curvature to cause a first bend within the thickness of material to form a first strain within a portion of the first thickness;
   a second substrate having a second thickness, the second substrate having a face and a backside, the second substrate overlying the face of the second substrate on a portion of the face of the first substrate to cause a second bend within the thickness of material to form a second strain within a portion of the second thickness, whereupon the face of the second substrate is joined to the face of the first substrate to form a sandwich structure while maintaining the first bend in the first substrate and the second bend in the second substrate;
   whereupon the first substrate includes a portion of a thickness that is released along a vicinity of the cleave plane to free the portion of the thickness of material from a remaining portion of the first substrate while being attached to the second substrate and the thickness of material conforms to a shape of the second substrate as a radius of curvature on the second substrate approaches a second predetermined radius (R2) of curvature thereby increasing a magnitude of a strain from the first strain to a third strain within the thickness of material as the thickness of conforms in shape to the second substrate as the radius of curvature on the first substrate approaches the second predetermined radius of curvature.

2. The system of claim 1 wherein the first predetermined radius of curvature is defined by an imaginary circle, the imaginary circle being continuous or variable.

3. The system of claim 1 wherein the second predetermined radius of curvature is defined by infinity.

4. The system of claim 1 further comprising an apparatus configured to physically mate the face of the second substrate to the face of the first substrate using a rolling action defined by an axis formed between a separated region between the face of the second substrate and the face of the first substrate and a connected region between the face of the second substrate and the face of the first substrate.

5. The system of claim 1 further comprising a mechanical clamp.

6. The system of claim 5 wherein the mechanical clamp is configured to maintain the first substrate overlying the surface region.

7. The system of claim 5 wherein the mechanical clamp is configured to maintain the second substrate overlying the first substrate.

8. The system of claim 1 wherein the first substrate comprises a first silicon wafer and the second substrate comprises a second silicon wafer.

9. The system of claim 8 wherein the first substrate comprises a silicon dioxide surface overlying the face of the first substrate.

10. The system of claim 1 further comprising a heat source configured to subject the sandwich structure to a heat treatment process.

11. The system of claim 1 further comprising a plasma source configured to expose the face of the first substrate and the face of the second substrate to a plasma prior to joining.

12. The system of claim 1 further comprising a vacuum source configured to cause the first substrate to overlie the surface region.

13. The system of claim 1 further comprising an electrostatic force configured to cause the first substrate to overlie the surface region.

14. The system of claim 1 further comprising a glue layer overlying the face of the first substrate.

* * * * *